United States Patent [19]

Shihabi et al.

[11] Patent Number: 5,452,331
[45] Date of Patent: Sep. 19, 1995

[54] SYMBOL LOCK DETECTION IMPLEMENTED WITH NONOVERLAPPING INTEGRATION INTERVALS

[75] Inventors: Mazen M. Shihabi; Sami M. Hinedi, both of Pasadena; Biren N. Shah, Sierra Madre, all of Calif.

[73] Assignee: The United States of America as represented by the Administrator of the National Aeronautics and Space Administration, Washington, D.C.

[21] Appl. No.: 250,301

[22] Filed: May 29, 1994

Related U.S. Application Data

[63] Continuation of Ser. No. 934,078, Aug. 14, 1992, abandoned.

[51] Int. Cl.$^6$ .................................... H04L 27/22
[52] U.S. Cl. ........................ 375/324; 375/340; 329/358
[58] Field of Search ............ 375/324, 325, 326, 327, 375/340; 370/20; 371/43; 329/304, 307, 347, 358, 360

[56] References Cited

U.S. PATENT DOCUMENTS

| 4,601,046 | 7/1986 | Namiki | 375/39 |
| 4,680,777 | 7/1987 | Saha | 375/53 |
| 4,866,738 | 9/1989 | Weismann et al. | 375/23 |
| 5,029,186 | 7/1991 | Maseng et al. | 375/39 |

OTHER PUBLICATIONS

S. Hinedi, "A Functional Description of the Advanced Receiver," TDA Progress Report 42-100, Jet Propulsion Laboratory, Pasadena, California, pp. 131-149, Feb. 15, 1990.

A. Mileant and S. Hinedi, "Costas Loop Lock Detection in the Advanced Receiver," TDA Progress Report 42-99, Jet Propulsion Laboratory, Pasadena, California, pp. 72-89, Nov. 15, 1989.

A. Mileant and S. Hinedi, "QPSK Loop Lock Detection in the Advanced Receiver," TDA Progress Report 42-101, Jet Propulsion Laboratory, Pasadena, California, pp. 164-178, May 15, 1990.

J. K. Holmes, *Coherent Spread Spectrum Systems*, John Wiley and Sons, New York, 1982, pp. 609-614.

K. T. Woo, "Shuttle Bit Sync Lock Detector Performance," TRW IOC, No. SCTE 50-76-184/KTW, TRW Corporation, El Segundo, Calif., Apr. 5, 1976.

M. Simon, "An Analysis of the Steady-State Phase Noise Performance of a Digital Data Transition Tracking Loop," JPL Space Programs Summary, 37-55, vol. 3, Jet Propulsion Laboratory Pasadena, Calif., pp. 54-62, Feb. 28, 1969.

M. K. Simon and A. Mileant, "SNR Estimation of the Baseband Assembly," TDA Progress Report 42-85, Jet Propulsion Laboratory, Pasadena, Calif. pp. 118-125, Jan.-Mar. 1986.

*Primary Examiner*—Young Tse
*Attorney, Agent, or Firm*—John H. Kusmiss; Thomas H. Jones; Guy M. Miller

[57] ABSTRACT

A symbol lock detector for an incoming coherent digital communication signal which utilizes a subcarrier modulated with binary symbol data, $d_k$, and known symbol interval T by integrating binary values of the signal over nonoverlapping first and second intervals selected to be T/2, delaying the first integral an interval T/2, and either summing or multiplying the second integral with the first one that preceded it to form a value $X_k$. That value is then averaged over a number M of symbol intervals to produce a static value Y. A symbol lock decision can then be made when the static value Y exceeds a threshold level δ.

3 Claims, 6 Drawing Sheets

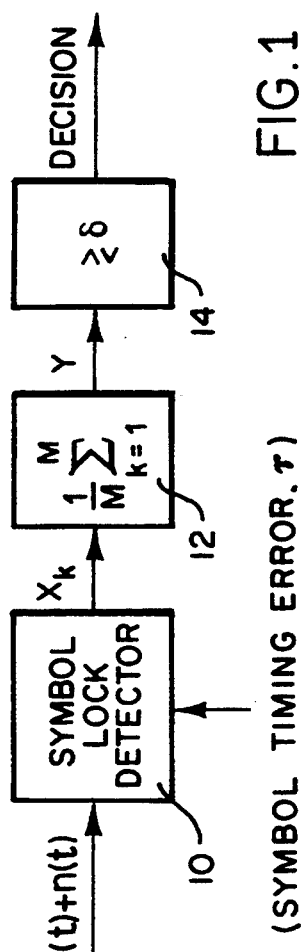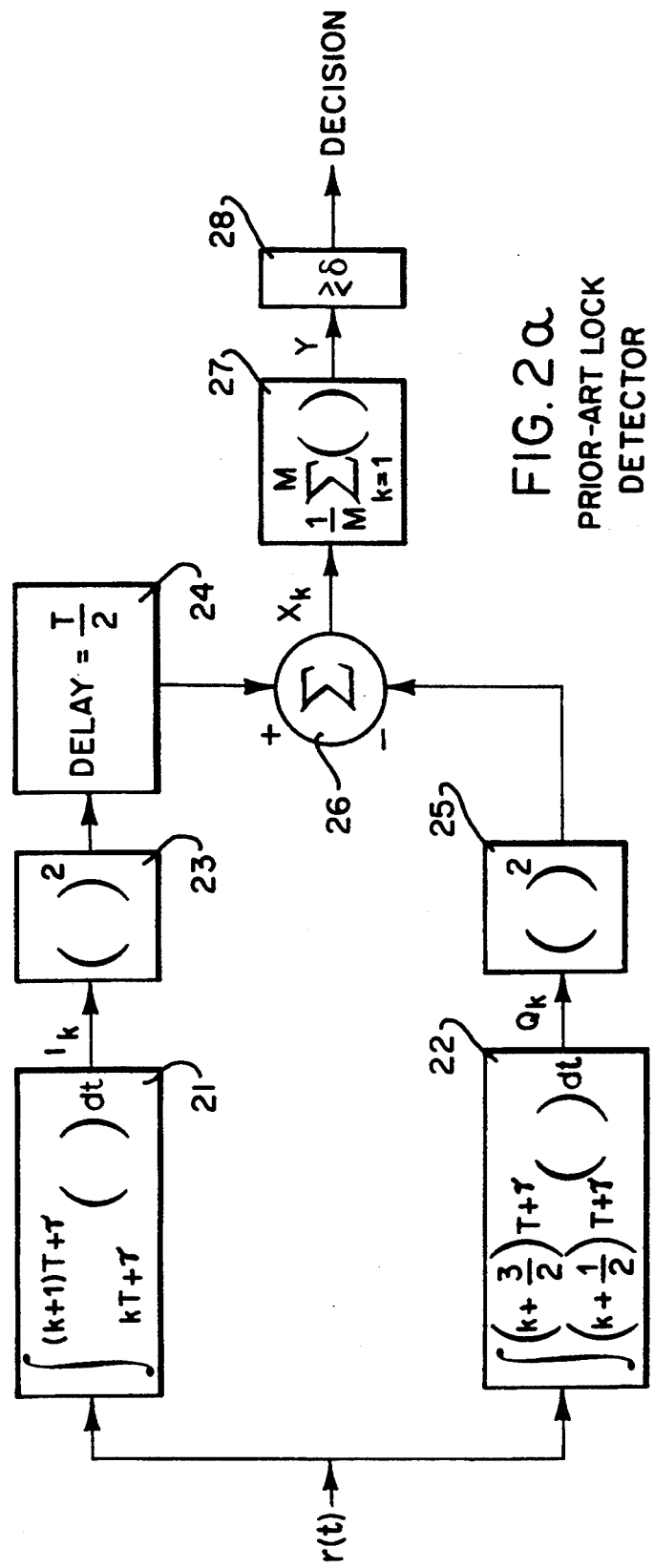

PRIOR-ART LOCK DETECTOR

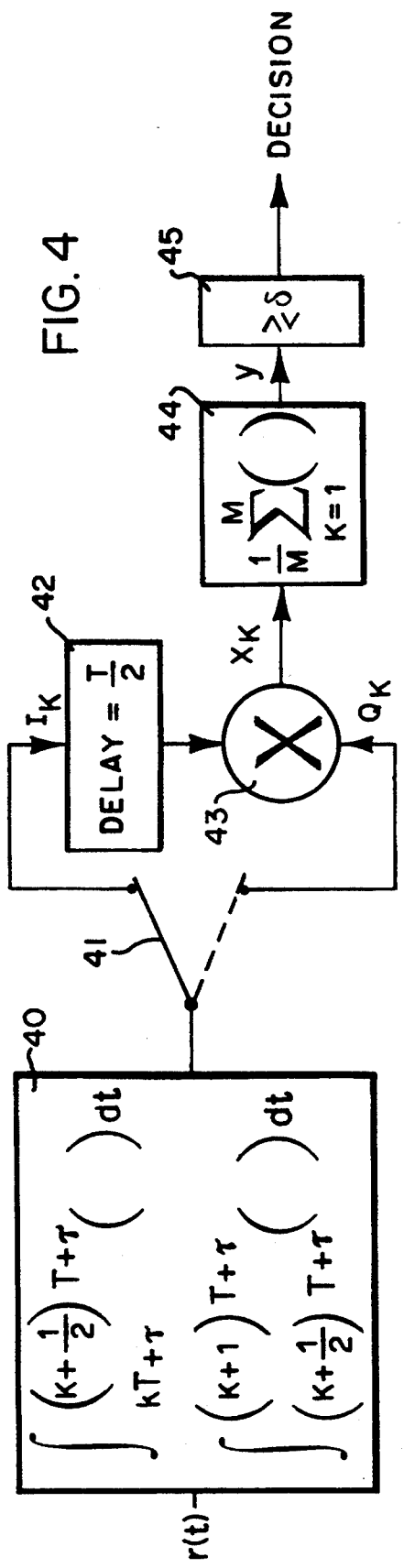
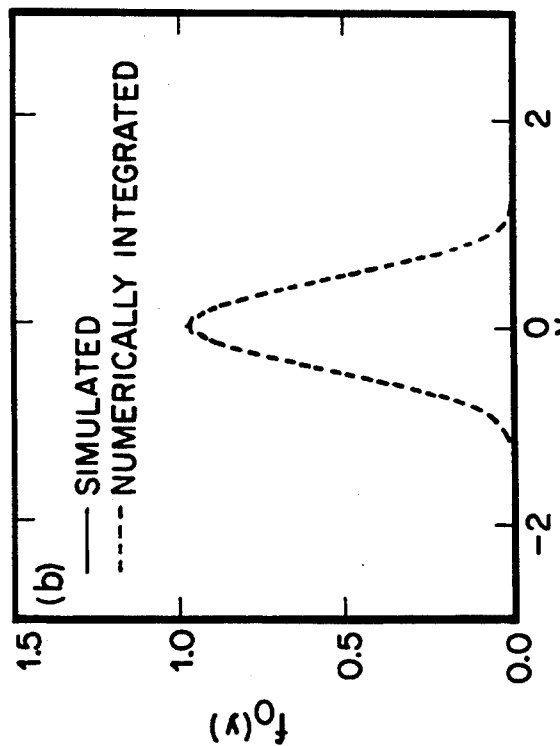
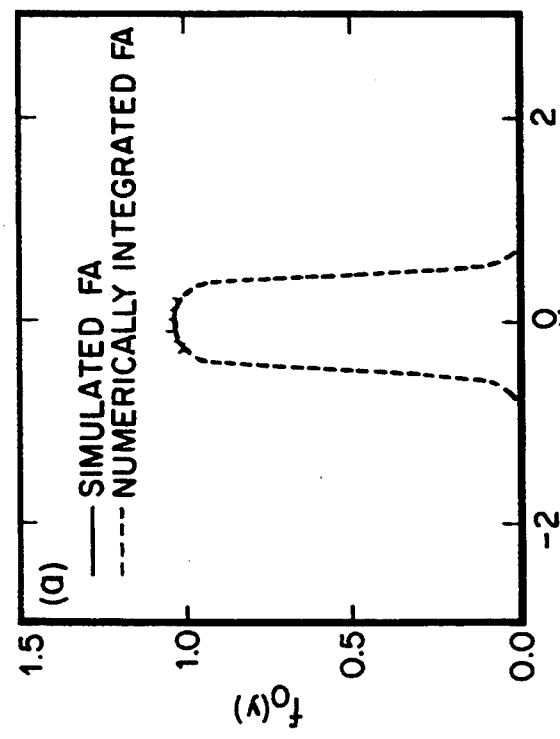

SYMBOL LOCK DETECTION IMPLEMENTED WITH NONOVERLAPPING INTEGRATION INTERVALS

ORIGIN OF INVENTION

The invention described herein was made in the performance of work under a NASA contract, and is subject to the provisions of Public Law 96-517 (35 USC 202) in which the contractor has elected not to retain title.

This application is a continuation, application Ser. No. 07/934,078, filed Aug. 14, 1992, now abandoned.

TECHNICAL FIELD

This invention relates to symbol lock detectors for coherent digital communication systems after carrier and subcarrier synchronization has been achieved in a phase lock loop, and more particularly to lock detectors which may be implemented with a single integrator for processing nonoverlapping symbol intervals of an incoming signal.

BACKGROUND ART

Deep space network (DSN) receivers currently under development use phase locked loops (PLLs) to track the carrier, subcarrier, and symbol phase. Like most coherent receivers, the DSN receivers rely on lock detectors to provide the symbol lock status of its PLLs. Since carrier, subcarrier, and symbol synchronization need to be achieved before any meaningful symbol detection can be initiated, symbol lock detectors play a vital role in the final decision of accepting or rejecting the detected symbols. In the past, symbol lock detectors have employed overlapping symbol intervals in their operations and therefore require two integrators operating over staggered time intervals.

During operation, a loop is assumed to be locked when its lock indicator consistently has a positive status. The carrier and subcarrier lock detectors currently used in DSN receivers have already been analyzed. The present invention concerns the analysis of three new symbol lock detectors which simplify implementation for DSN receivers and two prior-art symbol lock detectors for comparison.

Statement of the Invention

In accordance with the present invention, an incoming signal that has undergone carrier and subcarrier (if any) synchronization is processed to determine whether or not symbol lock has also been achieved. The symbol data, $d_k$, takes on the binary values of a pulse p(t) of a known duration, such as in a nonreturn-to-zero (NRZ) or Manchester code, where the probability of the data having a +1 is equal to having a −1 (or 0) value, (i.e., the data transition probability equals one half). While the prior-art lock detectors employ two integrators for processing two overlapping symbol intervals, the lock detectors of the present invention require only one integrator for processing two nonoverlapping time intervals, e.g., integration of the last half of one ($d_{k-1}/2$) and the first half ($d_k/2$) of the next symbol interval, followed by integration of the second half ($d_k/2$) of the next and the first half ($d_{k+1}/2$) of the following symbol interval, or the first half of each symbol interval followed by the second half of each symbol interval. The receiver is assumed to have perfect knowledge of the symbol interval T=kt, where k is the number of data bits, and t is the data bit interval.

The first integration output is processed and delayed a half symbol interval, T/2, for determining symbol lock by addition to or multiplication with the following integration output, where the processing of the first and second integration outputs is a squaring operation or an absolute value operation, and symbol lock is determined by addition of the processed second integration output to the processed first integration output delayed a half symbol interval and accumulating the sums. Symbol lock is then determined by repeatedly thresholding the accumulated sums every M symbol intervals. An alternative arrangement for determining symbol lock is by multiplying the second integration outputs by the first integration output delayed a half symbol interval to obtain a signal power estimation, and after accumulating signal power estimates over M symbol intervals, thresholding the accumulated estimates.

BRIEF DESCRIPTION OF THE DRAWINGS

FIG. 1 is a functinal block diagram common to symbol lock detectors shown in FIGS. 2a through 4.

FIG. 2a is a functional block diagram of a prior-art square-law symbol lock detector with integration of overlapping intervals (SQOD).

FIG. 4 is a functional block diagram of a signal-power symbol lock estimator (SPED) with integration of nonoverlapping (first and second) halves of incoming signal symbols in accordance with the presnet invention.

FIG. 5a and 5b are graphs of the probability density function of the output Y for the SQOD of FIG. 2a when symbol lock is not present and the output Y has a high SNR=5 dB and a low SNR=−5 dB, respectively.

DETAILED DESCRIPTION OF THE INVENTION

Figure 2B:
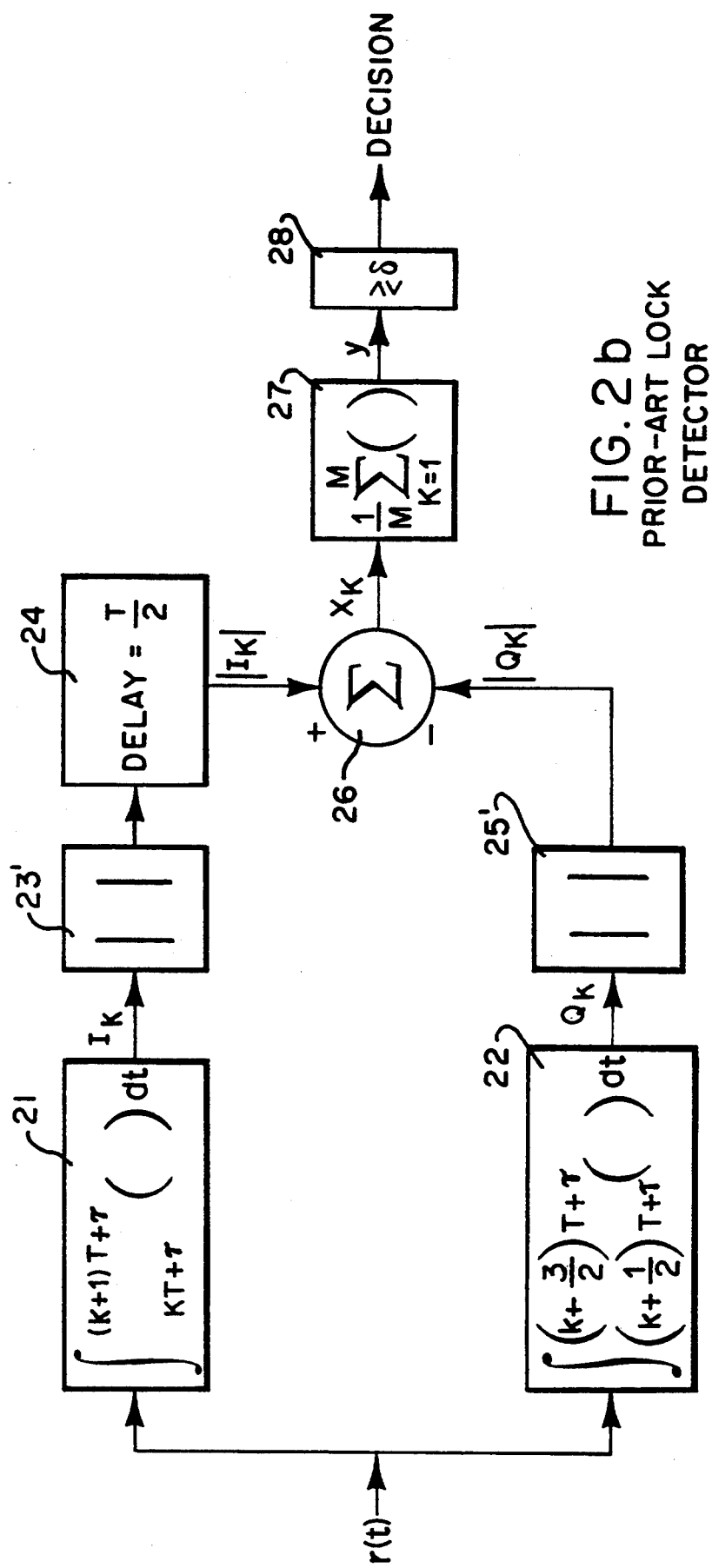
FIG. 2b is a functional block diagram of a prior-art absolute-value symbol lock detector with integration of overlapping intervals (AVOD).

The symbol lock detectors considered are divided into two groups. The detectors in the first group are prior-art symbol lock detectors that process the overlapping outputs of two symbol data bit integrators, whereas those in the second group, which depart from the prior art, use one integrator for two nonoverlapping intervals of an incoming signal to determine whether or not symbol lock has been achieved.

The first group of symbol lock detectors employ either the squares of the two overlapping integrator outputs or the absolute value of the integrator outputs. The second group consists of three new lock detectors, two of which use the same mathematical operations of squaring or taking the absolute values of integration outputs of nonoverlapping half symbol intervals but only one integrator, while the third detector, which also uses only one integrator, does not include either squaring or absolute value operations, and instead functions as a signal power estimator by multiplying the two integration outputs of nonoverlapping half symbol intervals.

The five lock detectors are compared based on the lock-detection probability as a function of the symbol SNR for a given false-alarm probability and a fixed observation interval.

Although symbol lock detection has been addressed before [J. K. Holmes, *Coherent Spread Spectrum System*, New York: John Wiley and Sons, 1982 and K. T. Woo, *Shuttle Bit Synch Lock Detector Performance*, TRW IOC No. SCTE 50-76-184/KTW, TRW Corporation, El Segundo, Calif., Apr. 5, 1976], the analyses have neglected the interdependence between symbol synchronizer bandwidth, and lock detector bandwidth. The symbol synchronizer bandwidth refers to the one-sided loop noise bandwidth $B_L$ of the digital data-transition tracking loop [M. Simon, "An Analysis of the Steady-State Phase Noise Performance of a Digital Data-Transition Tracking Loop," JPL *Space Programs Summary*, 37–55, Vol. 3, Jet Propulsion Laboratory, Pasadena, Calif., pp. 54–62, Feb. 28, 1969] used in the receivers. The lock detector bandwidth is defined as the frequency at which the lock detector provides a status signal of being in or out-of-lock. For example, the lock detectors considered here indicate loop status once every M symbols. Consequently, the bandwidth of these detectors is 1/MT, where T is the symbol interval.

The probability of false alarm, $P_{fa}$, is defined in two ways. In the classical sense, it is defined as the probability of declaring a signal (or target as in radar applications) to be present when it is not present. In deep space applications however, it is more appropriate to define $P_{fa}$ as the probability of declaring a loop to be in-lock when it is out-of-lock. That is, declaring the timing error to be zero (inlock) when the loop is slipping cycles and operating with a non-zero timing error (out-of-lock).

In discussion below, the false alarm rate is shown to be drastically different depending on the definition used. In addition when the loop is slipping cycles, the false alarm rate is shown to depend strongly on the ratio of the lock detector bandwidth to the symbol loop bandwidth. For example, when the loop is slipping and $1/B_L << MT$ the lock detectors operate with acceptable false alarm rates because there are several uncorrelated samples of the timing error $1/\tau$ within the MT second decision interval. On the other hand, when $1/B_L >> MT$ the false alarm rates are unacceptable because the timing error is constant over several decision intervals. Note that a good rule of thumb is to assume that the loop provides uncorrelated phase estimates every $1/B_L$ seconds. As a result, the symbol timing error at time $t_i$ is uncorrelated with the symbol timing error at time $t_j$ when $|t_i-t_j| \geq 1/B_L$. This article considers the special cases of $1/B_L=MT$ and $1/B_L=T$. The first case is analyzed and simulated whereas, the second is simulated but not analyzed. When the threshold is adjusted in the presence of noise only, the performance can be derived from the previous analysis by setting the signal amplitude to zero.

Generic Description of Lock Detectors

Figure 3A:
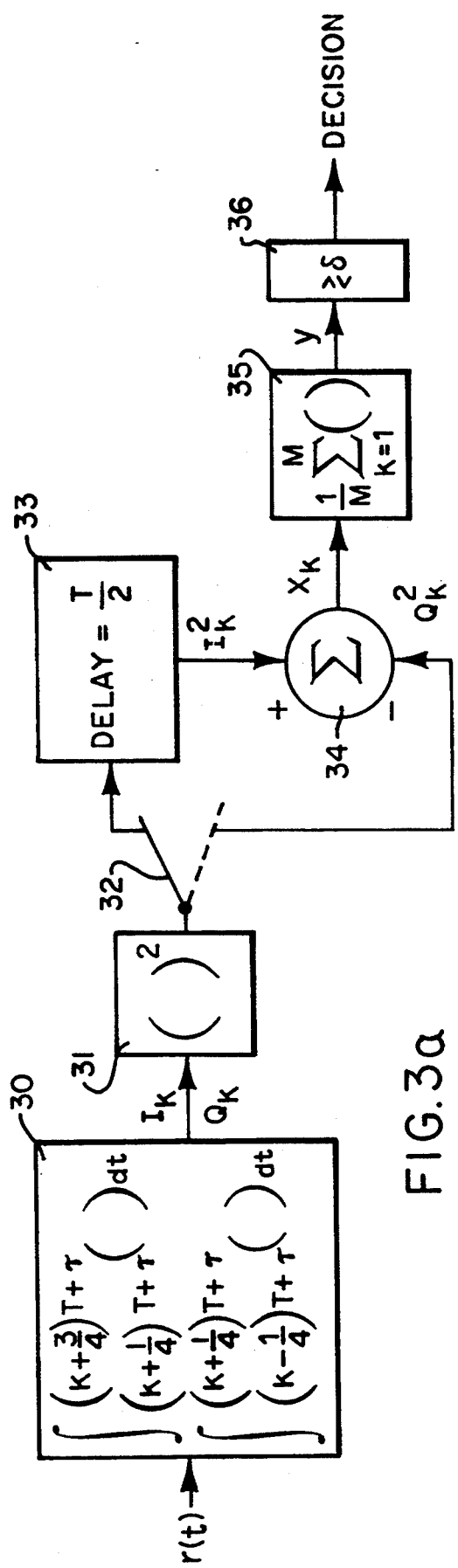
FIG. 3a is a functional block diagram of a square-law symbol lock detector with integration of nonoverlapping intervals (SQNOD) in accordance with the present invention.
Figure 3B:
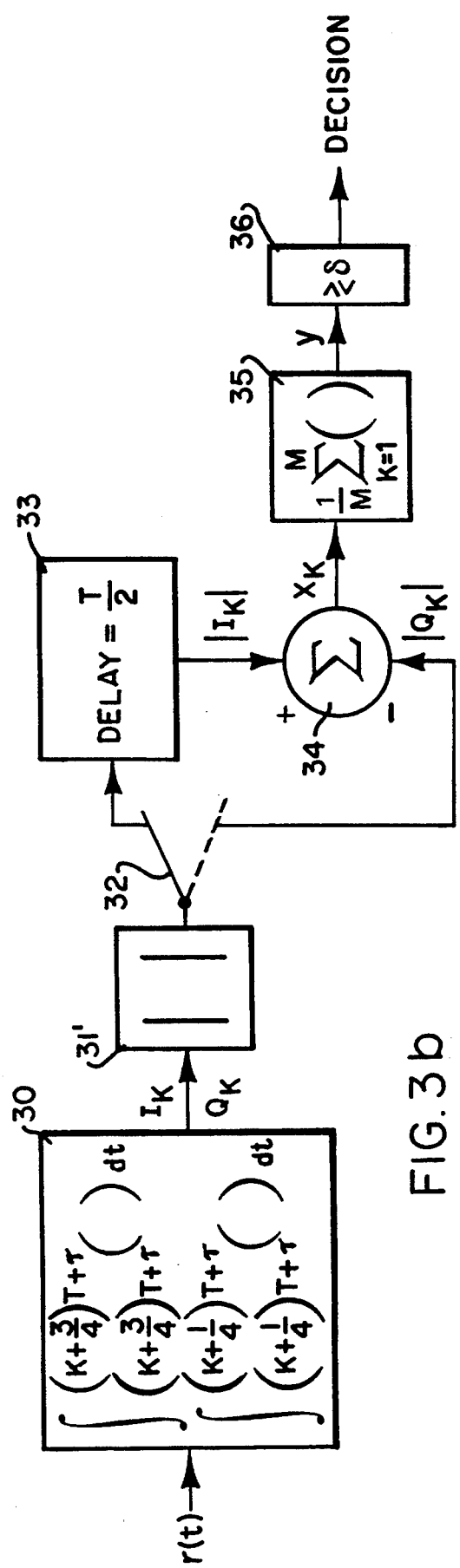
FIG. 3b is a functional block diagram of an absolute-value symbol lock detector with integration of nonoverlapping intervals (AVNOD) in accordance with the present invention.

FIG. 1 is a block diagram showing the signal processing functions common to the symbol lock detectors analyzed and discussed below, including both prior-art lock detectors of FIGS. 2a and 2b, and new lock detectors in accordance with the present invention as shown in FIGS. 3a, 3b, and 4. The received signal is assumed to have been mixed with perfect carrier and subcarrier local reference signals so that the input to the lock detectors is a baseband signal of the form $$r(t) = Ad(t) + n(t) \tag{1}$$

where A is the signal amplitude and $A^2$ is the received data power with $$d(t) = \sum_{k=-\infty}^{\infty} d_k p(t - kT) \tag{2}$$

and where n(t) is the additive white Gaussian noise process with a single-sided power spectral density (PSD) $N_O$ (Watts/Hz). The data symbol $d_k$ takes on the binary value +1 and −1 (or 0) with equal probability, and p(t) is the received data pulse shape of duration T seconds. For comparison purposes, only the NRZ pulse is considered in the analysis but the results can be extended to any pulse shape, such as Manchester encoded data. The receiver is assumed to have perfect knowledge of T, but not the symbol epoch, i.e., the receiver has estimated perfectly the symbol rate but not necessarily the start and end of the symbols.

The signal processing functions for the symbol lock detector 10 in FIG. i depend on the processing of integration outputs in the detector. Its output $X_k$ is at the symbol rate and typically many samples of $X_k$ are averaged in an accumulator 12 to obtain the decision statistic Y compared in a block 14 with a threshold value δ. If Y is greater than the threshold δ, the loop is declared to be in-lock, otherwise it is declared to be out-of-lock.

The symbol timing error (parameter) $\tau$ in FIG. 1 is the phase error between the symbol phase and the phase estimate provided by the symbol synchronizer. The in-lock case is analyzed by setting the timing error $\tau$ to zero. In practice, the error is not identically zero, but it is a very small value. When there is a signal present, the out-of-lock model for $\tau$ depends on the relation between $B_L$ and 1/(MT). When $B_L=1/(MT)$, $\tau$ is modeled as an unknown constant over a decision interval (MT seconds) but independent and uniformly distributed from one decision interval to the next.

Alternatively, when $B_L=1T$, the timing error is modeled as constant over a symbol interval, T, but independent and uniformly distributed from symbol to symbol. In this case, if the decision time MT>>T (as it usually is), each decision statistic encompasses the entire range of $\tau$. When there is no signal present, the model of $\tau$ is irrelevant because the out-of-lock performance is independent of $\tau$.

The respective prior-art and new detectors considered and compared below are the square-law detector with overlapping (SQOD) and non-overlapping (SQNOD) integrators shown in FIGS. 2a and 3a, the absolute-value detectors with overlapping (AVOD) and non-overlapping (AVNOD) integrators shown in FIGS. 2b and 3b, and finally the new signal power estimator detector (SPED) shown in FIG. 4.

In the prior-art SQOD detector, FIG. 2a, the input signal r(t) is integrated over two symbol periods by two integrators 21 and 22: one in phase with the estimated symbol interval and the other staggered by half a symbol duration. The resulting inphase and quadraphase samples $I_k$ and $Q_k$ are correlated due to the overlapping intervals. The quadrature samples $I_k$ are squared in a processor 23 and delayed a half symbol period by a delay element 24 while the samples $Q_k$ are squared in a processor 25. The delayed $(I_k)^2$ and the undelayed $(Q_k)^2$ samples are then combined in a summing circuit 26 to form an output $X_k$ which are averaged in an accumulator 27 to obtain the decision statistic Y which is then compared with a predetermined threshold $\delta$ in a detector 28 to reach a lock decision. The prior-art AVOD detector, FIG. 2b merely replaces the squaring operations in FIG. 2a with absolute value operations in blocks 23' and 25'. Hence, the I and Q samples of the prior-art AVOD detector are also correlated.

The new SQNOD detector, FIG. 3a, processes the integration outputs of nonoverlapping half symbol intervals from a single integrator 30. A single squaring operation in block 31 produces the square of the integration outputs from both halves of a symbol interval, and a multiplexer 32 separates the first and second half symbol interval integration outputs sending the first half through a delay element of half a symbol interval and the second half directly to a summing circuit 34. Its output $X_k$ is then averaged in an accumulator 35 and its output, and the decision statistic Y is compared with a threshold $\delta$ in a detector 36. As before, replacing the squaring operations in FIG. 3a with absolute value operations in block 31' yields its counterpart the AVNOD detector shown in FIG. 3b. The integrator outputs in these cases are uncorrelated because the integrated intervals are nonoverlapping.

The SPED detector shown in FIG. 4, which also uses a single integrator 40, was considered for symbol lock detection because it already existed as part of a split symbol moment SNR estimator [K. T. Woo, supra] in DSN receivers used for SNR estimation. The inphase ($I_k$) and quadraphase ($Q_k$) integration outputs of the SPED are obtained by integrating the received signal over the respective first and second halves of a symbol interval and separating them by a multiplexer 41. Since the noise in the first and second half are independent, delaying the inphase integration output, $I_k$, in a delay element 42 and then forming the product of $I_k$ and $Q_k$ in a multiplier 43 and averaging over number, M, of symbol intervals in an accumulator 44, provides as a decision statistic Y an estimate proportional to signal power which is then compared to the value $\delta$ in a threshold detector 45 to provide a lock decision.

Performance Analysis

In-lock performance is measured in terms of the probability of declaring a phase-locked loop (PLL) as being symbol locked when there is no timing error, i.e., the probability that the decision statistic Y is greater than the threshold value $\delta$ when $\tau=0$. Note that $\tau=0$, or no phase tracking error, is equivalent to setting the symbol synchronizer loop SNR to infinity. The degradation in detection probability due to timing jitter (non-infinite loop SNR) is minimal and has been addressed in the case of carrier lock detectors [A. Mileant and S. Hinedi, "Costas Loop Lock Detection in the Advanced Receiver," TDA Progress Report 42-99, Vol. July–September 1989, Jet Propulsion Laboratory, Pasadena, Calif. pp. 72–89, Nov. 15, 1989]. The out-of-lock performance is measured by the probability of false alarm, i.e., the probability of declaring the loop as locked when it is not locked. The out-of-lock performance in the presence of a signal is analyzed for the case $B_L=1/(MT)$. Note that, in that case, the timing error $\tau$ is independent from one symbol to another and the decision is performed after averaging a number, M, of symbols. On the other hand when $B_L=1/(MT)$, $\tau$ is an unknown constant during a decision interval and independent from one decision to the next. Setting M=1 in the latter case would imply a decision every symbol, which is fundamentally different from the case $B_L=1/T$ decision using M symbols. Hence, the performance when $B_L=1/T$ cannot be derived from the case of $B_L=1/(MT)$, simply by setting M=1. The out-of-lock performance when there is no signal present is also analyzed.

In this discussion, only the final equations are shown. Derivations of these equations are set forth in the various appendices A through F for all five symbol lock detectors SQOD, SQNOD, AVOD, AVNOD and SPED which, by this reference, are hereby made a part hereof. In all cases, the decision statistic can be expressed as the average of samples $X_k$ over M symbol intervals given by the equation $$Y = \frac{1}{M} \sum_{k=1}^{M} X_k \tag{3}$$

Note that the random variable $X_k$ is peculiar to each detector. When the timing offset $\tau=0$, the adjacent samples $X_k$ and $X_{k+1}$ are correlated in the two prior-art detectors (SQOD and SQNOD), whereas for the three new detectors (AVOD, AVNOD and SPED) they are uncorrelated. In all cases, the random variable $X_k$ is not Gaussian due the nonlinear operations on $I_k$ and $Q_k$. For large M, the random variable Y is modeled as Gaussian due to the Central Limit Theorem (CLT). The CLT theorem applies to the sum of correlated random variables when none of the variables being summed or multiplied dominates over the others [D. Fraser, *Non-Parametric Methods in Statistics*, New York: John Wiley and Sons, 1957]. This model for Y is justified by simulation results. The probability of lock detection is the probability that the Gaussian random variable Y surpasses the threshold $\delta$. Hence, it is given by $$P_D = \int_\delta^\infty \frac{1}{\sqrt{2\pi\sigma_Y^2}} \exp\left[-\frac{(y-\mu_Y)^2}{2\sigma_Y^2}\right] dy \tag{4}$$

where $\mu_Y$ and $\sigma_Y^2$ are the mean and variance of Y when $\tau$ is exactly zero. Using the definition of the error function $$\mathrm{erf}(x) \triangleq \frac{2}{\sqrt{\pi}} \int_0^x \exp(-t^2) dt \tag{5}$$

one has $$P_D = \frac{1}{2} - \frac{1}{2} \mathrm{erf}\left(\frac{\delta - \mu_Y}{\sqrt{2}\, \sigma_Y}\right) \tag{6}$$

-continued or $$P_D = \frac{1}{2} - \frac{1}{2} erf\left(\frac{\delta}{\sqrt{2}\ \sigma_Y} - \sqrt{\frac{SNR_D}{2}}\right) \quad (7)$$

where $SNR_D$ denotes the detector SNR defined by $$SNR_D \triangleq \left(\frac{\mu_Y}{\sigma_Y}\right)^2 \quad (8)$$

The threshold $\delta$ is chosen to maintain a fixed probability of false alarm. The probability of false alarm is the probability that the out-of-lock decision statistics do not surpass the threshold. Hence, it is given by $$P_{fa} = \int_{-\infty}^{\delta} f_o(y) dy \quad (9)$$

where $f_o(Y)$ is the out-of-lock density of Y. The threshold $\delta$ is computed by solving Eq. (9) for a fixed $P_{fa}$. When there is a signal present and $B_L = 1/(MT)$, the statistic Y is no longer Gaussian and $f_o(Y)$ must be obtained numerically or by simulation as shown below. When there is no signal present, the CLT can be invoked and the out-of-lock decision statistic can be modeled as Gaussian. This model is verified by simulations below. In this case, Eq. (9) can be written as $$P_{fa} = \frac{1}{2} - \frac{1}{2} erf\left(\frac{\delta - \mu_{Y_o}}{\sqrt{2}\ \sigma_{Y_o}}\right) \quad (10)$$

where $\mu_{Y_o}$ and $\sigma_{Y_o}$ the out-of-lock mean and variance of the decision statistic Y. The threshold $\delta$ is given by $$\delta = \sqrt{2}\ \sigma_{Y_o}\gamma + \mu_{Y_o} \quad (11)$$

where $\gamma = erf^{-1}(1-2P_{fa})$. Substituting Eq. (11) into Eq. (6) relates the probability of detection to the no signal (classical) false alarm rate, namely, $$P_D = \frac{1}{2} - \frac{1}{2} erf\left(\frac{\sqrt{2}\ \sigma_{Y_o}\gamma + \mu_{Y_o} - \mu_Y}{\sqrt{2}\ \sigma_Y}\right) \quad (12)$$

The next five subsections derive the in-lock and out-of-lock mean and variance for all five detectors SQOD, SQNOD, AVOD, AVNOD and SPED for comparison.

(1). Square-Law Lock Detector with Overlapping Intervals (SQOD)

The SQOD detector is shown in FIG. 2a. For the input given by Eq. (1), the inphase integrator output is given by $$I_k = \int_{kT+\tau}^{(k+1)T+\tau} r(t) dt \quad (13)$$
$$= d_k A(T-\tau) + d_{k+1} A\tau + N_1(k) + N_2(k)$$

and the quadraphase integrator output is given by $$Q_k = \int_{(k+\frac{1}{2})T+\tau}^{(k+3/2)T+\tau} r(t) dt \quad (14)$$

$$= \begin{cases} d_k A\left(\frac{T}{2} - \tau\right) + d_{k+1} A\left(\frac{T}{2} + \tau\right) + \\ N_2(k) + N_1(k+1) & 0 \leq \tau < \frac{T}{2} \\ d_{k+1} A\left(\frac{3T}{2} - \tau\right) + d_{k+2} A\left(\tau - \frac{T}{2}\right) + \\ N_2(k) + N_1(k+1) & \frac{T}{2} \leq \tau < T \end{cases}$$

where $\tau$ is limited to the interval [0,T], and where $$N_1(k) = \int_{kT+\tau}^{(k+\frac{1}{2})T+\tau} n(t) dt \quad (15)$$

and $$N_2(k) = \int_{(k+\frac{1}{2})T+\tau}^{(k+1)T+\tau} n(t) dt \quad (16)$$

Since n(t) is a white Gaussian process with one-sided PSD $N_o$, the $N_i$'s are independent Gaussian random variables with mean zero and variance $\sigma_n^2 = (N_o T)/4$. The samples $X_k = I_k^2 - Q_k^2$ and summing M of them yields Y. From Appendix A, the in-lock mean and variance of Y are given by $$\mu_Y = \frac{\eta_s N_o T}{2} \quad (17)$$

and $$\sigma_Y^2 = \left(\frac{N_o T}{M}\right)^2 \left[M\left(\frac{\eta_s^2}{4} + 2\eta_s + \frac{3}{4}\right) + \right. \quad (18)$$

$$\left. 2(M-1)\left(-\frac{\eta_s}{2} - \frac{1}{8}\right)\right]$$

The out-of-lock mean and variance when there is a signal present and $\tau$ is an unknown constant over a decision interval ($B_L = 1/(MT)$) are given by $$\mu_{Y_o} = 0.0 \quad (19)$$

$$\sigma_{Y_o}^2 = \left(\frac{N_o T}{M}\right)^2 \left[M\left(\frac{31\eta_s^2}{120} + \frac{41\eta_s}{24} + \frac{3}{4}\right) + 2(M-1) \times \right. \quad (20)$$

$$\left. \left(\frac{23\eta_s^2}{320} - \frac{23\eta_s}{48} - \frac{1}{8}\right) + (M-1)(M-2)\frac{\eta_s^2}{12}\right]$$

where $\eta_s$ denotes symbol signal-to-noise ratio and is defined as $$\eta_s \triangleq \frac{A^2 T}{N_o} \quad (21)$$

Setting A=0 in Eq. (20) and substituting the result in Eqs. (19) and (20) yields the out-of-lock mean and variance in the no signal case. Hence, the no signal mean is zero but the no signal variance is given by $$\sigma^2_{Y_o}(\eta_s = 0) = \left(\frac{N_o T}{M}\right)^2 \left[ M\frac{3}{4} - 2(M-1)\frac{1}{8} \right] \quad (22)$$

(2). Absolute-Value Lock Detector with Overlapping Intervals (AVOD)

For the AVOD detector shown in FIG. 2b, absolute values are used instead of squares. The expressions for $I_k$ and $Q_k$ given by Eqs. (13) and (14) are still valid but now $X_k = |I_k| - |Q_k|$. From Appendix B, the in-lock mean and variance are given by $$\mu_Y = \left(\sqrt{\frac{N_o T}{4}}\right) \left[ \frac{\exp(-\eta_s) - 1}{\sqrt{\pi}} + \sqrt{\eta_s}\, erf\sqrt{\eta_s} \right] \quad (23)$$

and $$\sigma_Y^2 = \frac{1}{M^2} [M\, Var(X_k) + M(M-1)Cov(X_k, X_{k+1})] \quad (24)$$

where $$Var(X_k) = (N_o T) \left\{ \frac{3\eta_s}{2} + 1 - \eta_s[F_1(\eta_s) + F_2(\eta_s)] - \right.$$

$$\frac{1}{4\pi} [\exp(-2\eta_s) - 2\exp(-\eta_s) + 1] - \frac{\eta_s}{4} erf^2(\sqrt{\eta_s}) -$$

$$\left. \frac{1}{2} \sqrt{\frac{\eta_s}{\pi}} erf\sqrt{\eta_s}\, )[\exp(-\eta_s) - 1] \right\} \quad (25)$$

and $$Cov(X_k, X_{k+1}) = (N_o T) \left\{ \frac{\exp(-2\eta_s) + \exp(-\eta_s)}{2\pi} + \right.$$

$$\frac{\eta_s}{2} erf^2(\sqrt{\eta_s}) + \left[ \exp(-\eta_s) + \frac{1}{2} \right] erf\sqrt{\eta_s}\, ) \times$$

$$\left. \sqrt{\frac{\eta_s}{\pi}} - \frac{\eta_s}{2} [F_1(\eta_s) + F_2(\eta_s)] \right\} \quad (26)$$

The out-of-lock mean and variance when there is a signal and τ0 is constant over M symbols are given by $$\mu_{Y_o} = 0.0 \quad (27)$$

and $$\sigma^2_{Y_o} = \frac{1}{M^2} [M\, Var_o(X_k) + 2(M-1)Cov_o(X_k, X_{k+1}) + \quad (28)$$

$$(M-1)(M-2)Cov_o(X_k, X_{k+2})]$$

where

-continued $$Var_o(X_k) = (N_o T) \left\{ \frac{4\eta_s}{3} + 1 - \eta_s \left[ \frac{3}{4} F_1(\eta_s) + G_1(\eta_s) + \right. \right. \quad (29)$$

$$\left. \left. \frac{H_1(\eta_s) + H_2(\eta_s) + H_3(\eta_s)}{2} \right] \right\}$$

$$Cov_o(X_k, X_{k+1}) = (N_o T) \left\{ \frac{\exp(-2\eta_s)}{2\pi} + \left( \frac{\eta_s}{2} + \frac{1}{8} \right) \times \right. \quad (30)$$

$$erf^2(\sqrt{\eta_s}\, ) + \exp(-\eta_s) erf\sqrt{\eta_s}\, ) \left( \sqrt{\frac{\eta_s}{\pi}} + \frac{1}{8\sqrt{\pi \eta_s}} \right) +$$

$$\frac{\eta_s}{4} \left[ F_3(\eta_s) + G_3(\eta_s) + H_4(\eta_s) - G_4(\eta_s) - H_5(\eta_s) - \right.$$

$$\left. \left. \frac{3}{2} F_1(\eta_s) - G_1(\eta_s) - 2G_2(\eta_s) - 2H_2(\eta_s) \right] \right\}$$

$$Cov_o(X_k, X_{k+j}) = \left( \frac{N_o T \eta_s}{4} \right) [F_3(\eta_s) + G_3(\eta_s) + H_4(\eta_s) - \quad (31)$$

$$2G_4(\eta_s) - 2H_5(\eta_s)] \quad \text{for } j \geq 2$$

The functions $F_i$, $G_i$ and $H_i$ in Eqs. (28) through (31) are defined in Appendix B and plotted in FIG. B.1 versus $\eta_s$. Setting $\eta_s = 0$ in Eqs. (28) through (31) yields the out-of-lock statistics in the no signal case. The no signal mean is zero but the variance is given by $$\sigma^2_{Y_o}(\eta_s = 0) = \left( \frac{N_o T}{M^2} \right) \left[ M + 2(M-1)\left( \frac{1}{2\pi} \right) \right] \quad (32)$$

(3). Square-Law Lock Detector with Nonoverlapping Intervals (SQNOD)

The SQNOD detector is shown in FIG. 2b. For the input of Eq. (1), The inphase and quadraphase integrator outputs are given by $$I_k = \int_{(k+\frac{1}{4})T + \tau}^{(k+\frac{3}{4})T + \tau} r(t) dt \quad (33)$$

$$= \begin{cases} d_k \frac{AT}{2} + N_1(k) & 0 \leq \tau < \frac{T}{4} \\ d_k A \left( \frac{3T}{4} - \tau \right) + \\ d_{k+1} A \left( \tau - \frac{T}{4} \right) + N_1(k) & \frac{T}{4} \leq \tau < \frac{T}{2} \end{cases}$$

and $$Q_k = \int_{(k-\frac{1}{4})T + \tau}^{(k+\frac{1}{4})T + \tau} r(t) dt \quad (34)$$

$$= \begin{cases} d_{k-1}A\left(\frac{T}{4} - \tau\right) + \\ d_k A\left(\frac{T}{4} + \tau\right) + N_2(k) & 0 \leq \tau < \frac{T}{4} \\ d_k \frac{AT}{2} + N_2(k) & \frac{T}{4} \leq \tau < \frac{T}{2} \end{cases}$$

The noises $N_1(k)$ and $N_2(k)$ are given by Eqs. (15) and (16) after changing the integration limits to those in Eqs. (33) and (34). As a result, they are independent Gaussian random variables with zero mean and variance $\sigma_n^2 = (N_oT)/4$. The sample $X_k$ is the difference of the squares (i.e., $X_k = I_k^2 - Q_k^2$). From Appendix D, the in-lock mean and variance of Y are given by $$\mu_Y = \frac{\eta_s N_o T}{8} \qquad (35)$$

and $$\sigma_Y^2 = \left(\frac{N_o^2 T^2}{M}\right)\left(\frac{\eta_s^2 + 24\eta_s + 16}{64}\right) \qquad (36)$$

For the case of false lock with signal present and $\tau$ an unknown constant over M symbols, one obtains $$\mu_{Y_o} = 0.0 \qquad (37)$$

and $$\sigma_{Y_o}^2 = \left(\frac{N_o^2 T^2}{M^2}\right) \times \qquad (38)$$

$$\left[M\left(\frac{\eta_s^2 + 25\eta_s + 15}{60}\right) + M(M-1)\frac{\eta_s^2}{120}\right]$$

When there is no signal present the out-of-lock mean is zero and the variance is given by setting $\eta_s = 0$ in Eq. (38). Consequently, the no signal out-of-lock variance is $$\sigma_{Y_o}^2(\eta_s = 0) = \left(\frac{N_o^2 T^2}{M}\right)\left(\frac{15}{60}\right) \qquad (39)$$

(4). Absolute-Value Lock Detector with Nonoverlapping Intervals (AVNOD)

This detector shown in FIG. 3b is the same as the SQNOD detector shown in FIG. 3a with the squaring operations replaced by absolute value operations. Hence, Eqs. (32) and (33) for $I_k$ and $Q_k$ are valid but now $X_k = |I_k| - |Q_k|$. From Appendix E, the in-lock statistics for Y are given by $$\mu_y = \sqrt{\frac{N_o T}{4}} \left[\frac{\exp\left(-\frac{\eta_s}{2}\right) - 1}{\sqrt{2\pi}} + \sqrt{\frac{\eta_s}{2}} \, erf\left(\sqrt{\frac{\eta_s}{2}}\right)\right] \qquad (40)$$

and $$\sigma_Y^2 = \left(\frac{N_0 T}{M}\right)\left\{\frac{3\eta_s}{8} + \frac{1}{2} - \frac{1}{8\pi}\left[1 + 5\exp(-\eta_s) + \right.\right. \qquad (41)$$

$$2\exp\left(-\frac{\eta_s}{2}\right)\bigg] - \sqrt{\frac{\eta_s}{32\pi}} \, erf\left(\sqrt{\frac{\eta_s}{2}}\right) \times$$

$$\left[5\exp\left(-\frac{\eta_s}{2}\right) + 1\right] - \frac{5\eta_s}{16} \, erf^2\left(\sqrt{\frac{\eta_s}{2}}\right)\bigg\}$$

The out-of-lock mean and variance when there is a signal present and $\tau$ an unknown constant over MT seconds is given by $$\mu_{Y_o} = 0.0 \qquad (42)$$

and $$\sigma_{Y_o}^2 = \frac{1}{M^2}\left[M\, Var_o(X_k) + M(M-1)Cov_o(X_k, X_{K+1})\right] \qquad (43)$$

$$Var_o(X_k) = (N_0 T)\bigg[\frac{5\eta_s}{12} + \frac{1}{2} - \frac{3}{4\pi}\exp(-\eta_s) - \qquad (44)$$

$$erf^2\left(\sqrt{\frac{\eta_s}{2}}\right)\left(\frac{1 + 3\eta_s}{8}\right) - \exp\left(-\frac{\eta_s}{2}\right) \times$$

$$erf\left(\sqrt{\frac{\eta_s}{2}}\right)\left(\frac{3}{2}\sqrt{\frac{\eta_s}{2\pi}} + \frac{1}{\sqrt{32\pi\eta_s}}\right)\bigg]$$

$$Cov_o(X_k, X_{k+1}) = (N_0T)\bigg\{-\frac{1}{16}\, erf^2\left(\sqrt{\frac{\eta_s}{2}}\right) - \qquad (45)$$

$$\exp\left(-\frac{\eta_s}{2}\right) \times erf\left(\sqrt{\frac{\eta_s}{2}}\right)\left(\frac{1}{8\sqrt{2\pi\eta_s}}\right) + \frac{\eta_s}{2}Z(\eta_s)\bigg\}$$

where the function Z is defined in Appendix E and plotted in FIG. B.2.

For the out-of-lock case with no signal, the mean is zero and the variance is obtained by setting $\eta_s = 0$ in Eqs. (43) through (45). Hence, the out-of-lock variance is given by $$\sigma_{Y_o}^2(\eta_s = o) = \frac{N_o T}{M}\left(\frac{1}{2} - \frac{3}{4\pi}\right) \qquad (46)$$

(5). Signal-Power Estimator Lock Detector (SPED)

In the detector shown in FIG. 4, denote the integrations over the first half of the assumed symbol interval as $I_k$ and the second half as $Q_k$. Then, the $I_k$ and $Q_k$ samples are given by $$I_k = d_k \frac{AT}{2} + N_1(k) \qquad (47)$$

and $$Q_k = d_k A\left(\frac{T}{2} - \tau\right) + d_{k+1} A\tau + N_2(k) \quad (48)$$

and $X_k = I_k Q_k$. From Appendix F, the in-lock mean and variance of Y are $$\mu_Y = \frac{\eta_s N_o T}{4} \quad (49)$$

and $$\sigma_Y^2 = \left(\frac{N_o^2 T^2}{M}\right)\left(\frac{2\eta_s + 1}{16}\right) \quad (50)$$

The out-of-lock case with signal present has mean and variance when $\tau$ is constant over M symbols is given by $$\mu_{Y_o} = \frac{\eta_s N_o T}{8} \quad (51)$$

and $$\sigma_{Y_o}^2 = \frac{N_o^2 T^2}{M^2}\left[M\left(\frac{5\eta_s^2 + 20\eta_s + 12}{192}\right) + M(M-1)\frac{\eta_s^2}{192}\right] \quad (52)$$

As before, the out-of-lock variance in the no signal case is given by $$\sigma_{Y_o}^2(\eta_s = 0) = \left(\frac{N_o^2 T^2}{M}\right)\left(\frac{12}{192}\right) \quad (53)$$

Discussion and Simulation Results

Digital simulation was used to verify the foregoing analysis. In the out-of-lock state for a long-time constant $B_L = 1/(MT)$, the symbol timing error $\tau$ is modeled as constant over a decision interval (MT seconds) but independent and uniformly distributed over the collection of all decision intervals. The timing error in the in-lock state is modeled as being zero. Although the special case of r constant over M symbols was analyzed for performance comparison purposes, it is not advisable to operate a practical system under these conditions due to unacceptable false alarm rates. This case has higher than usual false alarm rates because the decision statistic for small values of $\tau$ is not significantly different from the statistic for $\tau = 0$. As a result, the out-of-lock states corresponding to small values of $\tau$ are frequently declared to be in-lock because they are mistaken for the case when $\tau = 0$. This problem can be ameliorated by lengthening the observation time relative to the time constant of $\tau$ (i.e., shortening the time constant of $\tau$). In practice, it is recommended that the observation time be at least ten times longer than the time constant of $\tau$. As noted above, the out-of-lock density function for Y in this case is not Gaussian. Consider the decision statistic Y when the loop is out of lock and $\tau$ is constant over M symbols. In general, it can be written as $$X_k = s_k(\tau) + n_k + s_k(\tau)n_k \quad (54)$$

where, in all five detectors, the signal term $s_k$ is random and uniformly distributed because $\tau$ is a uniformly distributed random variable. The density of the noise $n_k$ depends on the detector being implemented. Summing M samples of $X_k$, where $X_k$ is at the symbol rate in all cases, yields the decision variable Y. Since $\tau$ is constant over the sum, at high SNR (i.e., for strong signal levels) the density function of Y approaches a uniform distribution as shown in FIG. 5a. However, at low SNR the noise term dominates and the density of Y is Gaussian due to the central limit theorem as shown in FIG. 5b. The density in FIGS. 5a and 5b was obtained via numerical integration as well as simulation. Both methods are seen to agree very well. The numerical method computed the density function of Y, $f(y)$, by averaging over $\tau$ the conditional pdf $f(y/\tau)$. The latter is Gaussian with mean and variance both a function of $\tau$. The simulation method computed the histogram of Y and then set $f(y) = [P(y - \Delta \geq Y \geq y + \Delta)]/\Delta$, where $\Delta$ is the size of a histogram bin. The histograms were generated using 1,00,000 million symbols which corresponds to 10,000 decisions (Y's), since there are 100 symbols/decision.

Figure 6:
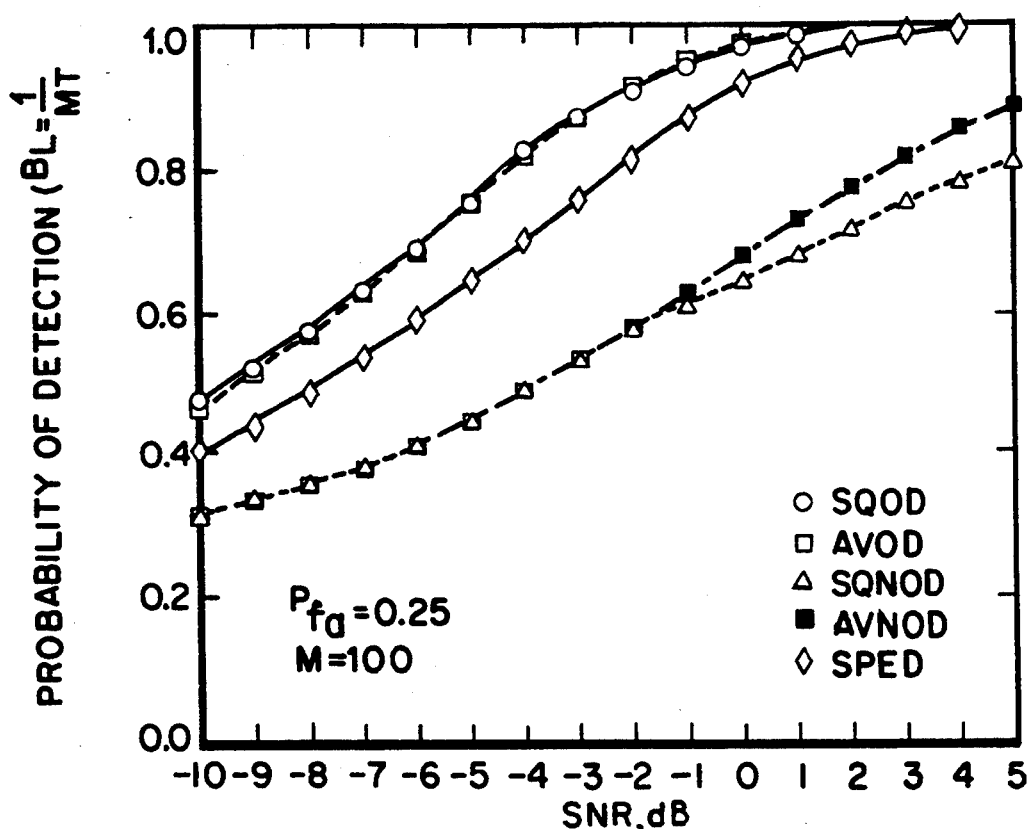
FIG. 6 is a graph of the probability of lock detection when $\tau$ is an unknown constant over a decision interval for symbol lock detection of FIGS. 2a, 2b, 3a, 3b and 4.

FIG. 6 compares the probability of detection performance of all five detectors for M=100 and $P_{fa}=0.25$. Note that the overlapping detectors SQOD and AVOD, which are identical except for the squaring and absolute value operations, have nearly identical performance. As expected, the AVOD is slightly better at high SNR, whereas the SQOD is slightly better at low SNR. The non-overlapping detectors SQNOD and AVNOD also have nearly equal performance. Once again, the absolute value operation yield better results at higher SNRs. The signal level estimator (SPED) is better than the non-overlapping detectors but worse than the overlapping detectors. The probability of detection results in FIG. 6 change when $P_{fa}$ or M change. For example, increasing the observation interval increases the detection probability because it increases the detector SNR=$(\mu_y^2/\sigma_{yu}^2)$. Accepting a higher false alarm rate increases the probability of detection because it lower the threshold $\delta$. In generating these curves, 50,000 symbols were simulated for each value of SNR. Since there are 100 symbols/decision, the detection probability for a given SNR is based on 500 decisions.

Figure 7:
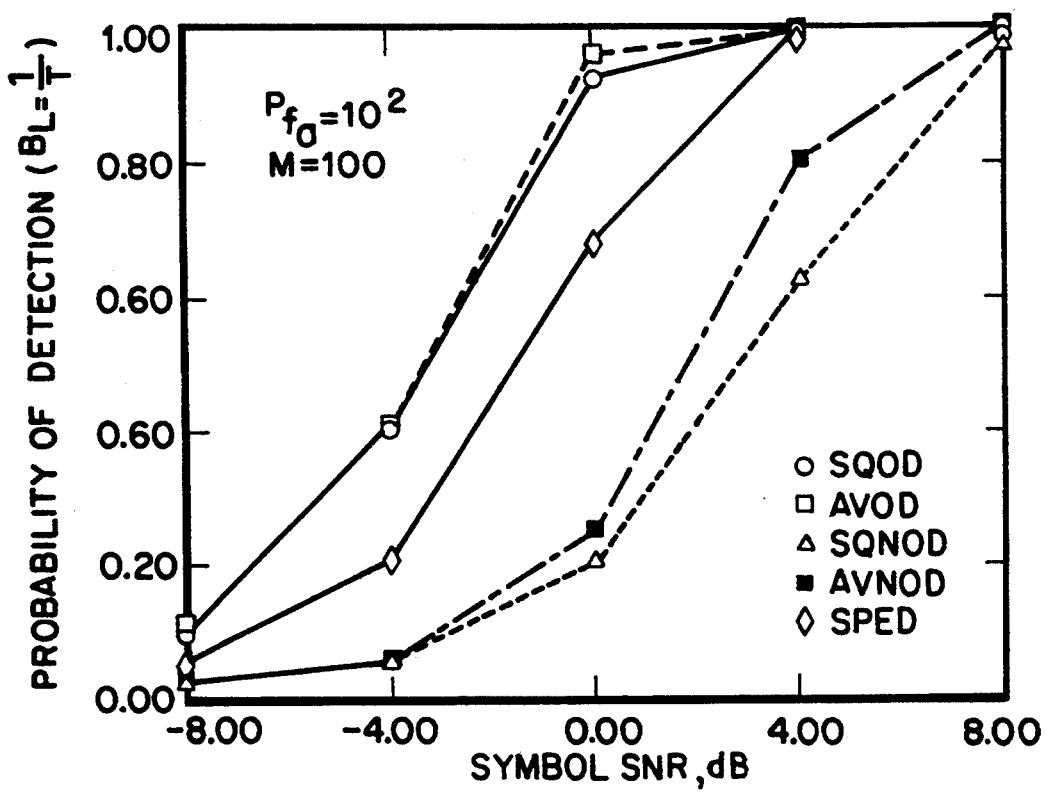
FIG. 7 is a graph of the probability of lock detection versus SNR when $\tau$ is uniformly distributed and changing from symbol to symbol for symbol lock detectors of FIGS. 2a, 2b, 3a, 3b and 4.

In the out-of-lock state for a short-time constant ($B_L = 1/T$), the symbol timing error z is modeled as uniformly distributed random variable that changes independently from symbol-to-symbol. For this case, the probabilities of detection for all five detectors are computed by simulation for M=100, $P_{fa}=10^{-2}$ and the threshold $\delta$ is set according to Eq. (11). The false alarm rate was verified by simulation. The results are plotted in FIG. 7 versus symbol energy-to-noise ratio $\eta_s$. In these computer simulations, the detection probability for a given SNR is based on 40,000 decisions.

The results show that, the AVOD performs slightly better than SQOD at high SNR, whereas they seem to perform identically at low SNR. The nonoverlapping detectors SQNOD and AVNOD also have nearly equal performance at low SNR, but AVNOD performs about 1 dB better for values of symbol SNR higher than $-4$ dB. As far as the SPED, it performs about 2 dB worse than the overlapping detectors and 3 dB better than the other two nonoverlapping detectors. Also by simulation, the false-alarm rate that was used in setting the threshold was verified.

Figure 8:
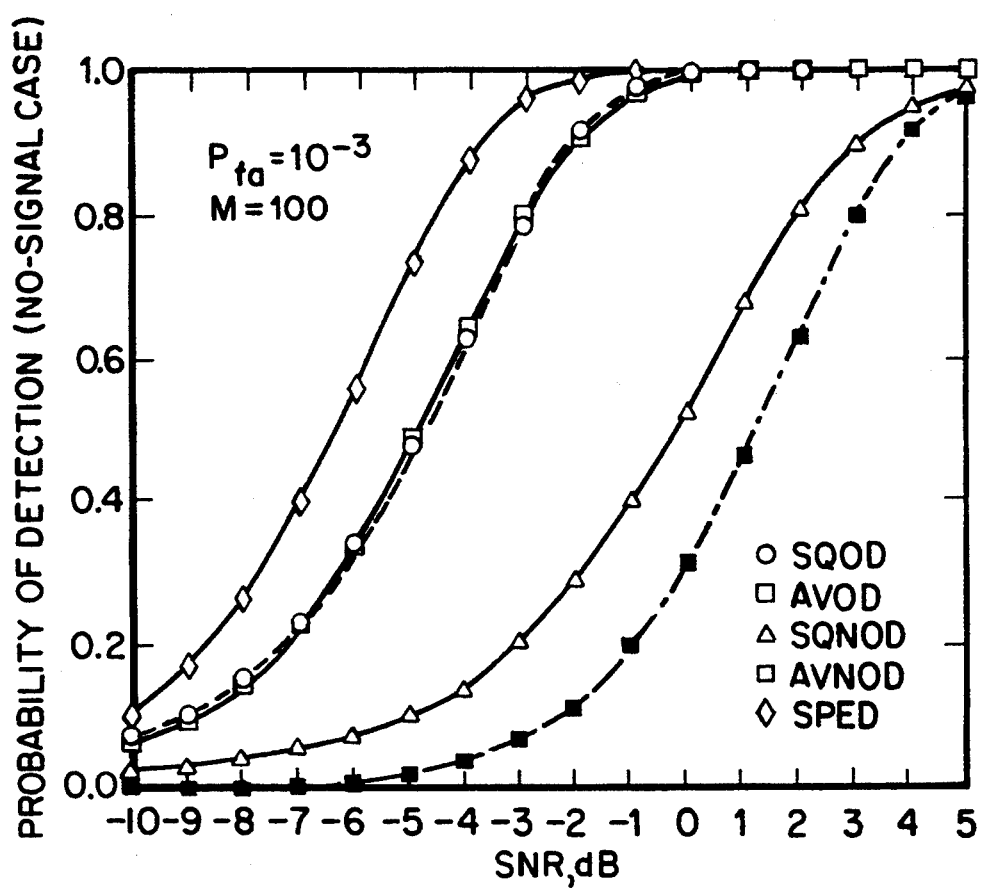
FIG. 8 is a graph of the probability of lock detection versus SNR when the false alarm rate is computed in the absence of a signal for symbol lock detectors of FIGS. 2a, 2b, 3a, 3b and 4.

In the situation of no signal, i.e., when there is no signal present as distinguished from the case when there is a signal and $\tau=0$, the out-of-lock statistic is Gaussian with zero mean and the in-lock statistic is Gaussian with non-zero mean. Probability of detection results are compared in FIG. 8. Interestingly, the performance of the overlapping and nonoverlapping detectors are grouped together, but the signal level detector (SPED) now has the best performance. The interdependence between $P_d$, $P_{fa}$ and M is the same as in the other two cases.

Conclusion

The performance of two prior-art symbol lock detectors shown in FIGS. 2a and 2b have been compared with three new ones shown in FIGS. 3a, 3b and 4. They are the square-law detector with overlapping (SQOD) compared with nonoverlapping (SQNOD) integrators and others, the absolute value detectors with overlapping (AVOD) compared with nonoverlapping (AVNOD) integrators and others, and the signal power estimator detector (SPED) compared with all others. The analysis considered various scenarios when the observation interval is much larger or equal to the symbol synchronizer loop bandwidth, which has not been considered in previous analyses. Also, the case of threshold setting in the absence of signal was considered. The analysis has shown that the square-law detector with overlapping integrators (SQOD) outperforms all others when the threshold is set in the presence of a signal, independent of the relationship between loop bandwidth and observation period. The square-law detector and absolute-value detector with overlapping integrators outperformed corresponding detectors with nonoverlapping integrators, but implementation of the SQOD and AVOD require two separate integrators since both integrators must operate at the same time due to overlapping, whereas the SQNOD and AVNOD symbol lock detectors may use a single interval since the separate integration operations required do not overlap in time. On the other hand, the signal-power estimator detector (SPED) outperforms all others when the threshold $\delta$ is set in the presence of noise only, and it requires only a single integrator for implementation.

Appendix A

Derivation of the Mean and Variance of the SQOD

The inphase and quadraphase integrator outputs are given by Eqs. (13) and (14), respectively. The output of the lock detector $X_k = I_k^2 - Q_k^2$. Consequently, $$\mu_k = \epsilon\{I_k^2\} - \epsilon\{Q_k^2\} \tag{A-1}$$

where $\mu_k = \epsilon\{X_k\}$.

$$\begin{aligned} Var(X_k) &= \epsilon\{[I_k^2 - Q_k^2]^2\} - \epsilon^2\{I_k^2 - Q_k^2\} \\ &= \epsilon\{I_k^4 + Q_k^4 - 2I_k^2 Q_k^2\} - \mu_k^2 \end{aligned} \tag{A-2}$$

The covariance of $X_k$ with $X_{k+j}$ is $$\begin{aligned} Cov(X_k, X_{k+j}) = &\epsilon\{I_k^2 I_{k+j}^2\} + \epsilon\{Q_k^2 Q_{k+j}^2\} - \\ &\epsilon\{I_k^2 Q_{k+j}^2\} - \epsilon\{I_{k+j}^2 Q_k^2\} - \mu_k \mu_{k+j} \end{aligned} \tag{A-3}$$

When the loop is in lock, Eqs. (A-1) through (A-3) are evaluated with $\tau$ set to zero in Eqs. (A-10) through (A-18). Hence, the in-lock moments of $X_k$ are given by $$Var(X_k) = \frac{A^4 T^4}{4} + 8A^2 T^2 \sigma_n^2 + 12\sigma_n^2 \tag{A-4}$$

and $$Cov(X_k, X_{k+1}) = -2A^2 T^2 \sigma_n^2 - 2\sigma_n^4 \tag{A-5}$$

and for $j \geq 2$, this can be shown to be $$Cov(X_k, X_{k+j}) = 0 \tag{A-6}$$

When the loop is out-of-lock, $\tau$ is modelled as a uniform random variable. Using this model for $\tau$ in Eqs. (A-10) through (A-18) and substituting the results into Eqs. (A-1) through (A-3) give the out-of-lock moments of $X_k$. Namely, (where the additional subscript 0 denotes out-of-lock), $$Var_0(I_k^2 - Q_k^2) = \frac{31A^4 T^4}{120} + \frac{41}{6} A^2 T^2 \sigma_n^2 + 12\sigma_n^4 \tag{A-7}$$

$$Cov_0(X_k, X_{k+1}) = \frac{23A^4 T^4}{320} - \frac{23}{12} A^2 T^2 \sigma_n^2 - 2\sigma_n^4 \tag{A-8}$$

and for $j \geq 2$, this can be shown to be $$Cov_0(X_k, X_{k+j}) = \frac{A^4 T^4}{12} \tag{A-9}$$

The following equations were used to compute the variance of $X_k$ and covariance of $X_k$ with $X_{k+1}$:

$$\epsilon\{I_k^2\} = A^2(T^2 - 2T\epsilon\{\tau\} + 2\epsilon\{\tau^2\}) + 2\sigma_n^2 \tag{A-10}$$

$$\epsilon\{|Q_k^2|\} = \begin{cases} A^2(\frac{T^2}{2} \epsilon_1\{1\} + 2\epsilon_1\{\tau^2\}) + 2\sigma_n^2 \epsilon_1\{1\} & 0 \leq \tau < \frac{T}{2} \\ A^2(\frac{5T^2}{2} \epsilon_2\{1\} - 4T\epsilon_2\{\tau\} + 2\epsilon_2\{\tau^2\}) + 2\sigma_n^2 \epsilon_2\{1\} & \frac{T}{2} \leq \tau < T \end{cases} \tag{A-11}$$

$$\epsilon\{I_k^4\} = A^4(T^4 - 4T^3 \epsilon\{\tau\} + 12T^2 \epsilon\{\tau^2\} - 16T\epsilon\{\tau^3\} + 8\epsilon\{\tau^4\}) + A^2 \sigma_n^2(12T^2 - 24T\epsilon\{\tau\} + 24\epsilon\{\tau^2\}) + 12\sigma_n^4 \tag{A-12}$$

$$\epsilon\{Q_k^4\} = \begin{cases} A^4(\frac{T^4}{2} \epsilon_1\{1\} + 8\epsilon_1\{\tau^4\}) + \\ A^2 \sigma_n^2(6T^2 \epsilon_1\{1\} + 24\epsilon_1\{\tau^2\}) + 12\sigma_n^4 \epsilon_1\{1\} \end{cases} \quad 0 \leq \tau < \frac{T}{2} \tag{A-13}$$

-continued $$\begin{cases} A^4(-\frac{17T^4}{2}\epsilon_2\{1\} - 32T^3\epsilon_2\{\tau\} + 48T^2\epsilon_2\{\tau^2\} - 32T\epsilon_2\{\tau^3\} + 8\epsilon_2\{\tau^4\}) + \\ A^2\sigma_n^2(30T^2\epsilon_2\{1\} - 48T\epsilon_2\{\tau\} + 24\epsilon_2\{\tau^2\}) + 12\sigma_n^4\epsilon_2\{1\} \end{cases} \quad \frac{T}{2} \leq \tau < T$$

(A-14)

$$\epsilon\{I_k^2 Q_k^2\} = \begin{cases} A^4(-\frac{T^4}{2}\epsilon_1\{1\} + 2T^2\epsilon_1\{\tau^2\} - 8T\epsilon_1\{\tau^3\} + 8\epsilon_1\{\tau^4\}) + \\ A^2\sigma_n^2(5T^2\epsilon_1\{1\} - 8T\epsilon_1\{\tau\} + 16\epsilon_1\{\tau^2\}) + 6\sigma_n^4\epsilon_1\{1\} & 0 \leq \tau < \frac{T}{2} \\[1em] A^4(-\frac{5T^4}{2}\epsilon_2\{1\} - 9T^3\epsilon_2\{\tau\} + 15T^2\epsilon_2\{\tau^2\} - 12T\epsilon_2\{\tau^3\} + 4\epsilon_2\{\tau^4\}) + \\ A^2\sigma_n^2(7T^2\epsilon_2\{1\} - 6T\epsilon_2\{\tau\} + 4\epsilon_2\{\tau^2\}) + 6\sigma_n^4\epsilon_2\{1\} & \frac{T}{2} \leq \tau < T \end{cases}$$

$$\epsilon\{I_k^2 I_{k+1}^2\} = A^4(T^4 - 4T^3\epsilon\{\tau\} + 8T^2\epsilon\{\tau^2\} - 8T\epsilon\{\tau^3\} + 4\epsilon\{\tau^4\}) + A^2\sigma_n^2(4T^2 - 8T\epsilon\{\tau\} + 8\epsilon\{\tau^2\}) + 4\sigma_n^4 \quad \text{(A-15)}$$

(A-16)

$$\epsilon\{Q_k^2 Q_{k+1}^2\} = \begin{cases} A^4(-\frac{T^4}{4}\epsilon_1\{1\} + 2T^2\epsilon_1\{\tau^2\} + 4\epsilon_1\{\tau^4\}) + \\ A^2\sigma_n^2(2T^2\epsilon_1\{1\} + 8\epsilon_1\{\tau^2\}) + 4\sigma_n^4\epsilon_1\{1\} & 0 \leq \tau < \frac{T}{2} \\[1em] A^4(-\frac{25T^4}{4}\epsilon_2\{1\} - 20T^3\epsilon_2\{\tau\} + 26T^2\epsilon_2\{\tau^2\} - 16T\epsilon_2\{\tau^3\} + 4\epsilon_2\{\tau^4\}) + \\ A^2\sigma_n^2(10T^2\epsilon_2\{1\} - 16T\epsilon_2\{\tau\} + 8\epsilon_2\{\tau^2\}) + 4\sigma_n^4\epsilon_2\{1\} & \frac{T}{2} \leq \tau < T \end{cases}$$

(A-17)

$$\epsilon\{I_k^2 Q_{k+1}^2\} = \begin{cases} A^4(-\frac{T^4}{2}\epsilon_1\{1\} - T^3\epsilon_1\{\tau\} + 3T^2\epsilon_1\{\tau^2\} - 4T\epsilon_1\{\tau^3\} + 4\epsilon_1\{\tau^4\}) + \\ A^2\sigma_n^2(3T^2\epsilon_1\{1\} - 4T\epsilon_1\{\tau\} + 8\epsilon_1\{\tau^2\}) + 4\sigma_n^4\epsilon_1\{1\} & 0 \leq \tau < \frac{T}{2} \\[1em] A^4(-\frac{5T^4}{2}\epsilon_2\{1\} - 9T^3\epsilon_2\{\tau\} + 15T^2\epsilon_2\{\tau^2\} - 12T\epsilon_2\{\tau^3\} + 4\epsilon_2\{\tau^4\}) + \\ A^2\sigma_n^2(7T^2\epsilon_2\{1\} - 12T\epsilon_2\{\tau\} + 8\epsilon_2\{\tau^2\}) + 4\sigma_n^4\epsilon_2\{1\} & \frac{T}{2} \leq \tau < T \end{cases}$$

(A-18)

$$\epsilon\{I_{k+1}^2 Q_k^2\} = \begin{cases} A^4(-\frac{T^4}{2}\epsilon_1\{1\} - T^3\epsilon_1\{\tau\} + 3T^2\epsilon_1\{\tau^2\} - 4T\epsilon_1\{\tau^3\} + 4\epsilon_1\{\tau^4\}) + \\ A^2\sigma_n^2(5T^2\epsilon_1\{1\} - 2T\epsilon_1\{\tau\} + 4\epsilon_1\{\tau^2\}) + 6\sigma_n^4\epsilon_1\{1\} & 0 \leq \tau < \frac{T}{2} \\[1em] A^4(\frac{5T^4}{2}\epsilon_2\{1\} - \frac{39T^3}{4}\epsilon_2\{\tau\} + \frac{71T^2}{4}\epsilon_2\{\tau^2\} - 15T\epsilon_2\{\tau^3\} + 5\epsilon_2\{\tau^4\}) + \\ A^2\sigma_n^2(13T^2\epsilon_2\{1\} - 24T\epsilon_2\{\tau\} + 16\epsilon_2\{\tau^2\}) + 6\sigma_n^4\epsilon_2\{1\} & \frac{T}{2} \leq \tau < T \end{cases}$$

where, in the above equations $$\epsilon\{f(\tau)\} \triangleq \int_0^T f(\tau)p(\tau)d\tau \quad \text{(A-19)}$$

$$\epsilon_1\{f(\tau)\} \triangleq \int_0^{\frac{T}{2}} f(\tau)p(\tau)d\tau \quad \text{(A-20)}$$

$$\epsilon_2\{f(\tau)\} \triangleq \int_{\frac{T}{2}}^T f(\tau)p(\tau)d\tau \quad \text{(A-21)}$$

where $p(\tau)$ is the probabilty density function of the variable $\tau$.

Appendix B

Derivation of the Mean and Variance of the AVOD

Note that the calculations in this appendix incorportate the results of Appendix C. The inphase and quadraphase outputs are given, respectively, by Eqs. (13) and (14). The lock detector output $X_k = |I_k| - |Q_k|$. Let $\mu_k = \epsilon\{|I_k| - |Q_k|\}$. Then, $$\begin{aligned} Var(X_k) &= \epsilon\{[|I_k| - |Q_k|]^2\} - \mu_k^2 \\ &= \epsilon\{I_k^2 + Q_k^2 - 2|I_k Q_k|\} - \mu_k^2 \end{aligned} \quad \text{(B-1)}$$

and $$\begin{aligned} Cov(X_k, X_{k+j}) &= \epsilon\{[|I_k| - |Q_k| - \mu_k][|I_{k+j}| - |Q_{k+j}| - \mu_{k+j}]\} \\ &= \epsilon\{|I_k I_{k+j}|\} + \epsilon\{|Q_k Q_{k+j}|\} - \\ &\quad \epsilon\{|I_k Q_{k+j}|\} - \epsilon\{|I_{k+j} Q_k|\} - \mu_k \mu_{k+j} \end{aligned} \quad \text{(B-2)}$$

The following equations were used to compute the variance of $X_k$ and the covariance of $X_k$ with $X_{k+1}$:

$$\epsilon\{X_k\} = \begin{cases} \frac{1}{2}[\epsilon_1\{|AT - 2A\tau + N|\} - \epsilon_1\{|2A\tau + N|\}] & 0 \leq \tau < \frac{T}{2} \\ \frac{1}{2}[\epsilon_2\{|AT - 2A\tau + N|\} - \epsilon_2\{|2AT - 2A\tau + N|\}] & \frac{T}{2} \leq \tau < T \end{cases} \quad \text{(B-3)}$$

$$\epsilon\{|I_k Q_k|\} = \begin{cases} \frac{1}{2}[\epsilon_1\{|[AT + N_1(k) + N_2(k)][AT + N_2(k) + N_1(k+1)]|\} + \\ \epsilon_1\{|[AT - 2A\tau + N_1(k) + N_2(k)][-2A\tau + N_2(k) + N_1(k+1)]|\}] & 0 \leq \tau < \frac{T}{2} \\ \frac{1}{4}[\epsilon_2\{|[AT + N_1(k) + N_2(k)][AT + N_2(k) + N_1(k+1)]|\} + \\ \epsilon_2\{|[AT + N_1(k) + N_2(k)][2AT - 2A\tau + N_2(k) + N_1(k+1)]|\} + \\ \epsilon_2\{|[AT - 2A\tau + N_1(k) + N_2(k)][2AT - 2A\tau + N_2(k) + N_1(k+1)]|\} + \\ \epsilon_2\{|[AT - 2A\tau + N_1(k) + N_2(k)][AT + N_2(k) + N_1(k+1)]|\}] & \frac{T}{2} \leq \tau < T \end{cases} \quad \text{(B-4)}$$

$$\epsilon\{|I_k I_{k+1}|\} = \frac{1}{4}[\epsilon^2\{|AT + N_1(k) + N_2(k)|\} + \quad \text{(B-5)}$$
$$\epsilon\{|[AT - 2A\tau + N_1(k) + N_2(k)][AT - 2A\tau + N_1(k+1) + N_2(k+1)]|\} +$$
$$2\epsilon\{|AT + N_1(k) + N_2(k)|\}\epsilon\{|AT - 2A\tau + N_1(k+1) + N_2(k+1)|\}]$$

$$\epsilon\{|Q_k Q_{k+1}|\} = \begin{cases} \frac{1}{4}[\epsilon_1^2\{|AT + N_1 + N_2|\} + \epsilon_1\{|[2A\tau + N_1(k+1) + N_2(k)] \times \\ [2A\tau + N_1(k+2) + N_2(k+1)]|\} + \\ 2\epsilon\{|AT + N_1 + N_2|\}\epsilon_1\{|2A\tau + N_1 + N_2|\}] & 0 \leq \tau < \frac{T}{2} \\ \frac{1}{4}[\epsilon_2^2\{|AT + N_1 + N_2|\} + \epsilon_2\{|[2AT - 2A\tau + N_1(k+1) + N_2(k)] \times \\ [2AT - 2A\tau + N_1(k+2) + N_2(k+1)]|\} + \\ 2\epsilon\{|AT + N_1 + N_2|\}\epsilon_2\{|2AT - 2A\tau + N_1 + N_2|\}] & \frac{T}{2} \leq \tau < T \end{cases} \quad \text{(B-6)}$$

$$\epsilon\{|I_k Q_{k+1}|\} = \begin{cases} \frac{1}{4}[\epsilon^2\{|AT + N_1 + N_2|\} + \epsilon_1\{|[2A\tau + N_1(k+1) + N_2(k)] \times \\ [AT - 2A\tau + N_1(k+2) + N_2(k+1)]|\} + \\ 2\epsilon\{|AT + N_1 + N_2|\}\epsilon_1\{|2A\tau + N_1 + N_2|\}] & 0 \leq \tau < \frac{T}{2} \\ 1/4[\epsilon^2\{|AT + N_1 + N_2|\} + \epsilon_2\{|[AT - 2A\tau + N_1(k+1) + N_2(k)] \times \\ [2AT - 2A\tau + N_1(k+2) + N_2(k+1)]|\} + \\ 2\epsilon\{|AT + N_1 + N_2|\}\epsilon\{|AT - 2A\tau + N_1 + N_2|\}] & \frac{T}{2} \leq \tau < T \end{cases} \quad \text{(B-7)}$$

$$\epsilon\{|I_{k+1} Q_k|\} = \begin{cases} \frac{1}{4}[\epsilon_1\{|[AT + N_1(k+1) + N_2(k+1)][AT + N_1(k+1) + N_2(k)]|\} + \\ \epsilon_1\{|[AT - 2A\tau + N_1(k+1) + N_2(k+1)][AT + N_1(k+1) + N_2(k)]|\} + \\ \epsilon_1\{|[AT - 2A\tau + N_1(k+1) + N_2(k+1)][2A\tau + N_1(k+1) + N_2(k)]|\} + \\ \epsilon_1\{|[AT + N_1(k+1) + N_2(k+1)][2A\tau + N_1(k+1) + N_2(k)]|\}] & 0 \leq \tau < \frac{T}{2} \\ \frac{1}{2}[\epsilon_1\{|[AT - 2A\tau + N_1(k+1) + N_2(k+1)][2AT - 2A\tau + N_1(k+1) + N_2(k)]|\} + \\ \epsilon_2\{|[AT + N_1(k+1) + N_2(k+1)][AT + N_1(k+1) + N_2(k)]|\}] & \frac{T}{2} \leq \tau < T \end{cases} \quad \text{(B-8)}$$

where $\epsilon_1$ and $\epsilon_2$ are defined in Appendix A. The following functions were defined to obtain the results in Subsection III.A of the main text.

$$F_1(\eta_s) \triangleq \epsilon\{|(1+cn_1+cn_2)(1+cn_2+cn_3)|\}$$

$$F_2(\eta_s) \triangleq \epsilon\{|(1+cn_1+cn_2)(cn_2+cn_3)|\}$$

$$F_3(\eta_s) \triangleq \epsilon\{|(1-2u+cn_1+cn_2)(1-2u+cn_3+cn_4)|\}$$

$$G_1(\eta_s) \triangleq \epsilon_1\{|(1-2u+cn_1+cn_2)(2u+cn_2+cn_3)|\}$$

$$G_2(\eta_s) \triangleq \epsilon_1\{|(1-2u+cn_1+cn_2)(1+cn_2+cn_3)|\}$$

$$G_3(\eta_s) \triangleq \epsilon_1\{|(2u+cn_1+cn_2)(2u+cn_3+cn_4)|\}$$

$$G_4(\eta_s) \triangleq \epsilon_1\{|(2u+cn_1+cn_2)(1-2u+cn_3+cn_4)|\}$$

$$H_1(\eta_s) \triangleq \epsilon_2\{|(1+cn_1+cn_2)(2-2u+cn_2+cn_3)|\}$$

$$H_2(\eta_s) \triangleq \epsilon\{|(1-2u+cn_1+cn_2)(2-2u+cn_2+cn_3)|\}$$

$$H_3(\eta_x) \triangleq \epsilon\{|(1-2u+cn_1+cn_2)(1+cn_2+cn_3)|\}$$

$$H_4(\eta_s) \triangleq \epsilon\{|(2-2u+cn_1+cn_2)(2-2u+cn_3+cn_4)|\}$$

$$H_5(\eta_s) \triangleq \epsilon\{|(1-2u+cn_1+cn_2)(2-2u+cn_3+cn_4)|\} \quad \text{(b-9)}$$

where $c \triangleq 1/(2\sqrt{\eta_s})$, the $n_i$'s are normal independent random variables with zero mean and unit variance, and u is a uniform random variable in the range [0, 1]. These functions have been computed as follows: In the F functions, the expectation with respect to u is carried over the entire region [0, 1], while in G and H functions, the expectation is carried over [0, ½] and [½, 1], respectively.

Appendix C

Derivation of the Mean for the Random Variable $|n+b\tau+c|$

Let n be a normal random variable with zero mean and variance $\sigma^2$, $\tau$ a uniform random variable over (0, T), and c any constant. Then, $$\epsilon\{|n + c|\} = \frac{1}{\sqrt{2\pi\sigma^2}} \int_{-\infty}^{\infty} |n + c| \exp\left(-\frac{n^2}{2\sigma^2}\right) dn \tag{C-1}$$

The above integral can be easily evaluated by breaking it into two integrals over the two regions $(-\infty, -c)$ and $(-c, \infty)$ to obtain $$\epsilon\{|n + c|\} = \sqrt{\frac{2\sigma^2}{\pi}} \exp\left(-\frac{c^2}{2\sigma^2}\right) + c\, erf\left(\frac{c}{\sqrt{2\sigma^2}}\right) \tag{C-2}$$

For a fixed $\tau$, one can write $$\epsilon\{|n + b\tau + c|\} = \tag{C-3}$$

$$\sqrt{\frac{2\sigma^2}{\pi}} \exp\left(-\frac{(b\tau + c)^2}{2\sigma^2}\right) + (b\tau + c) erf\left(\frac{b\tau + c}{\sqrt{2\sigma^2}}\right)$$

Unconditioning over $\tau$ yields $$\epsilon_1\{|n + b\tau + c|\} = \frac{1}{T} \int_0^{\frac{T}{2}} \left[ \sqrt{\frac{2\sigma^2}{\pi}} \exp\left(-\frac{(b\tau + c)^2}{2\sigma^2}\right) + \right. \tag{C-4}$$

$$\left. (b\tau + c) erf\left(\frac{b\tau + c}{\sqrt{2\sigma^2}}\right) \right] d\tau$$

which, after integration by parts, leads to $$\epsilon_1\{|n + b\tau + c|\} = \frac{\sigma^2}{2bT} \left[ erf\left(\frac{\frac{bT}{2} + c}{\sqrt{2\sigma^2}}\right) - erf\left(\frac{c}{\sqrt{2\sigma^2}}\right) \right] + \tag{C-5}$$

$$\frac{1}{2bT} \left[ \left(\frac{bT}{2} + c\right)^2 erf\left(\frac{\frac{bt}{2} + c}{\sqrt{2\sigma^2}}\right) - c^2 erf\left(\frac{c}{\sqrt{2\sigma^2}}\right) \right] +$$

$$\sqrt{\frac{\sigma^2}{2\pi}} \frac{1}{bT} \left[ \left(\frac{bT}{2} + c\right) \exp\left(\frac{-\left(\frac{bT}{2} + c\right)^2}{2\sigma^2}\right) - c\exp\left(\frac{-c^2}{2\sigma^2}\right) \right]$$

By applying the above expression, one gets $$\epsilon_1\{|AT - 2A\tau + N_1 + N_2|\} = \tag{C-6}$$

$$\sqrt{N_0 T} \left[ \frac{1}{8\sqrt{\eta_s}} erf(\sqrt{\eta_s}) + \frac{\sqrt{\eta_s}}{4} erf(\sqrt{\eta_s}) + \frac{1}{4\sqrt{\pi}} \exp(-\eta_s) \right]$$

Also, by simple manipulation, it can be shown that $$\begin{aligned}\epsilon_1\{|AT - 2A\tau + N_1 + N_2|\} &= \epsilon_2\{|AT - 2A\tau + N_1 + N_2|\} \\ &= \epsilon_1\{|2A\tau + N_1 + N_2|\} \\ &= \epsilon_2\{|2AT - 2A\tau + N_1 + N_2|\}\end{aligned} \tag{C-7}$$

Appendix D

Derivation of the Mean and Variance of the SQNOD

The samples $I_k$ and $Q_k$ are given by Eqs. (33) and (34). The moments of $X_k$ are given by Eqs. (A-1) through (A-3). Using Eqs. (D-7) through (D-10) with $\tau=0$ and Eqs. (A-2) and (A-3) yields the in-lock variance. Namely, $$Var(X_k) = \frac{A^4 T^4}{64} + \frac{3}{2} A^2 T^2 \sigma_n^2 + 4\sigma_n^2 \tag{D-1}$$

The covariance can be shown to be, for $j \geq 1$, $$cov(X_k, X_{k+j}) = 0 \tag{D-2}$$

Similarly, with $\tau$ modelled as uniform over [0, T/2] in Eqs. (D-7) through (D-10), the out-of-lock moments are found. Hence, $$Var_o(X_k) = \frac{A^4 T^4}{60} + \frac{5}{3} A^2 T^2 \sigma_n^2 + 4\sigma_n^4 \tag{D-3}$$

The out-of-lock covariance can be shown to be, for $j \geq 1$, $$Cov_o(X_k, X_{k+j}) = \frac{A^4 T^4}{120} \tag{D-4}$$

The following equations are used in computing the variance of $X_k$:

$$\epsilon\{I_k^2\} = \begin{cases} (-\frac{A^2T^2}{4} + \sigma_n^2)\epsilon_1\{1\} & 0 \leq \tau < \frac{T}{4} \\ A^2(\frac{5T^2}{8}\epsilon_2\{1\} - 2T\epsilon_2\{\tau\} + 2\epsilon_2\{\tau^2\}) + \sigma_n^2\epsilon_2\{1\} & \frac{T}{4} \leq \tau < \frac{T}{2} \end{cases} \quad \text{(D-5)}$$

$$\epsilon\{Q_k^2\} = \begin{cases} A^2(\frac{T^2}{8}\epsilon_1\{1\} + 2\epsilon_1\{\tau^2\}) + \sigma_n^2\epsilon_1\{1\} & 0 \leq \tau < \frac{T}{4} \\ (\frac{A^2T^2}{4} + \sigma_n^2)\epsilon_2\{1\} & \frac{T}{4} \leq \tau < \frac{T}{2} \end{cases} \quad \text{(D-6)}$$

$$\epsilon\{I_k^4\} = \begin{cases} (\frac{A^4T^4}{16} + \frac{3}{2}A^2T^2\sigma_n^2 + 3\sigma_n^4)\epsilon_1\{1\} & 0 \leq \tau < \frac{T}{4} \\ A^4(\frac{17T^4}{32}\epsilon_2\{1\} - 4T^3\epsilon_2\{\tau\} + 12T^2\epsilon_2\{\tau^2\} - 16T\epsilon_2\{\tau^3\} + 8\epsilon_2\{\tau^4\}) \\ A^2\sigma_n^2(\frac{15}{4}T^2\epsilon_2\{1\} - 12T\epsilon_2\{\tau\} + 12\epsilon_2\{\tau^2\}) + 3\sigma_n^4\epsilon_2\{1\} & \frac{T}{4} \leq \tau < \frac{T}{2} \end{cases} \quad \text{(D-7)}$$

$$\epsilon\{Q_k^4\} = \begin{cases} A^4(\frac{T^4}{32}\epsilon_1\{1\} + 8\epsilon_1\{\tau^4\}) + A^2\sigma_n^2(\frac{3}{4}T^2\epsilon_1\{1\} + 12\epsilon_1\{\tau^2\}) + 3\sigma_n^4\epsilon_1\{1\} & 0 \leq \tau < \frac{T}{4} \\ (\frac{A^4T^4}{16} + \frac{3}{2}A^2T^2\sigma_n^2 + 3\sigma_n^4)\epsilon_2\{1\} & \frac{T}{4} \leq \tau < \frac{T}{2} \end{cases} \quad \text{(D-8)}$$

Appendix E

Derivation of the Mean and Variance of the AVNOD

By following the same procedure as in Appendix B and by using $$\epsilon\{|I_k|\} = \begin{cases} \epsilon_1\{|\frac{AT}{2} + N|\} & 0 \leq \tau < \frac{T}{4} \\ \frac{1}{2}[\epsilon_2\{|\frac{AT}{2} + N|\} + \epsilon_2\{|AT - 2A\tau + N|\}] & \frac{T}{4} \leq \tau < \frac{T}{2} \end{cases} \quad \text{(E-1)}$$

$$\epsilon\{|Q_k|\} = \begin{cases} \frac{1}{2}[\epsilon_1\{|\frac{AT}{2} + N|\} + \epsilon_1\{|2A\tau + N|\}] & 0 \leq \tau < \frac{T}{4} \\ \epsilon_2\{|\frac{AT}{2} + N|\} & \frac{T}{4} \leq \tau < \frac{T}{2} \end{cases} \quad \text{(E-2)}$$

and $$\mathrm{Var}(|I_k| - |Q_k|) = \begin{cases} \frac{3A^2T^2}{8}\epsilon_1\{1\} + 2A^2\epsilon_1\{\tau^2\} + 2\sigma_n^2\epsilon_1\{1\} - \\ 5/4\epsilon_1^2\{|\frac{AT}{2} + N|\} - \frac{1}{4}\epsilon_1^2\{|2A\tau + N|\} - \\ \frac{1}{2}\epsilon\{|\frac{AT}{2} + N|\}\epsilon_1\{|2A\tau + N|\} & 0 \leq \tau < \frac{T}{4} \\ \frac{7A^2T^2}{8}\epsilon_2\{1\} - 2A^2T\epsilon_2\{\tau\} + 2A^2\epsilon_2\{\tau^2\} + 2\sigma_n^2\epsilon_2\{1\} - \\ 5/4\epsilon_2^2\{|\frac{AT}{2} + N|\} - \frac{1}{4}\epsilon_2^2\{|AT - 2A\tau + N|\} - \\ \frac{1}{2}\epsilon\{|\frac{AT}{2} + N|\}\epsilon_2\{|AT - 2A\tau + N|\} & \frac{T}{4} \leq \tau < \frac{T}{2} \end{cases} \quad \text{(E-3)}$$

one obtains Eqs. (40) through (45) after using the results of Appendix C and lengthy manipulations. The function Z in Eq. (45) is defined as $$Z(\eta_s) \triangleq \epsilon_1\{|(u+cn_1)(u+cn_2)|\} \quad \text{(E-4)}$$

where $c \triangleq 1/(2\sqrt{\eta_x})$, the $n_i$'s are normal independent random variables with zero mean and unit variance, and u is a uniform random variable in the range (0, 1). In Z, the expectation with respect to u is over the range [0, ¼].

Appendix F

Derivation of the Mean and Variance of the SPED

The samples $I_k$ and $Q_k$ are given by Eqs. (47) and (48). The output of the lock detector is $x_k = I_k Q_k$. It is straightforward to show that $$\epsilon\{X_k\} = \frac{A^2T^2}{4} - \frac{A^2T}{2} \epsilon(\tau) \qquad \text{(F-1)}$$

$$\epsilon\{X_k^2\} = A^4 \left( \frac{T^4}{16} - \frac{T^3\epsilon\{\tau\}}{4} + \frac{T^2\epsilon\{\tau^2\}}{2} \right) \qquad \text{(F-2)}$$

$$\sigma_n^4 + A^2\sigma_n^2 \left( \frac{T^2}{2} - T\epsilon\{\tau\} + 2\epsilon\{\tau^2\} \right)$$

$$Cov(X_k,X_{k+j}) = \begin{cases} \frac{A^4T^2}{4} Var(\tau) & \tau \sim u\left(0,\frac{T}{2}\right) \text{ and } j \geq 1 \\ 0 & \tau = 0 \end{cases} \qquad \text{(F-3)}$$

Equations (49) and (50) follow after letting $\tau = 0$ in Eqs. (F-1) through (F-3). Equations (51) and (52) follow by letting $\tau$ be uniform over $[0, T/2]$.

We claim:

1. A symbol lock detector for use in coherent digital communication systems after synchronization of a carrier and any subcarrier has been achieved, where symbol data, dk, takes on binary values with equal probability, and symbol interval, T, is known, comprising a single integrator for continuously integrating an incoming signal to form in sequence pairs of nonoverlapping first and second integrals over successive intervals, each integral selected to be over an interval T/2, means for delayinq said first inteqral of each of said pairs of integrals for said interval, T/2, in transmitting said first inteqral of each of said pairs of integrals, means for multiplying said first integral delayed by delay means and said second integral of each of said pairs of integrals to produce a value $X_k$, means for multiplexing said first integral of each of said pairs of integrals to said delay means and for multiplexing said second integral of each of said pairs of integrals directly to said means for multiplying, thereby providing for multiplication of said first integral of each of said pairs of integrals by said second integral of each of said pairs of integrals, means for averaging said value $X_k$ over a number of symbol intervals to produce a statistic value y, and means for thresholding said statistic value y at a level $\epsilon$ to produce a symbol lock decision when said statistic value y exceeds said level $\epsilon$.

2. A symbol lock detector for use in coherent digital communication systems after synchronization of a carrier and any subcarrier has been achieved, where symbol data, $d_k$, takes on binary values with equal probability, and symbol interval, T, is known, comprising a single integrator for continuously integrating an incoming signal to form in sequence pairs of nonoverlapping first and second integrals over successive intervals, each integral selected to be over an interval T/2, a single means for squaring each of said first and second integrals of each of said pairs of integrals in sequence, thereby producing first and second squared integrals, means for delaying said first squared inteqral with respect to said second squared inteqral by said interval T/2, means for summing said first squared integral delayed by delay means and said second squared integral to produce a value $X_k$, means for multiplexing said first squared integral to said delay means and said second squared integral to summing means, thereby forming a sum of said first squared integral delayed by said delay means and said second squared integral that is said value $X_k$, means for averaging said value $X_k$ over a number of symbol intervals to produce a statistic value y, and means for thresholding said statistic value y at a level $\epsilon$ to produce a symbol lock decision when said statistic value y exceeds said level $\epsilon$.

3. A symbol lock detector for use in coherent digital communication systems after synchronization of a carrier and any subcarrier has been achieved, where symbol data, $d_k$, takes on binary values with equal probability, and symbol interval, T, is known, comprising a single integrator for continuously integrating an incoming signal to form in sequence pairs of nonoverlapping first and second integrals over successive intervals, each integral selected to be over an interval T/2, a single means for forming the absolute value of each of said first and second integrals of each of said pairs of integrals in sequence, thereby producing first and second absolute-value integrals, and means for delaying said first absolute-value inteqral with respect to said second absolute-value inteqral by said interval T/2, means for summing said first absolute-value integral delayed by delay means and said second absolute-value inteqral to produce a value $X_k$, means for multiplexing said first absolute-value integral to said delay means and said second absolute-value integral directly to said summing means, thereby forming a sum of said first absolute-value integral delayed by said delay means and said second absolute-value integral that is said value $X_k$, means for averaging said value $X_k$ over a number of symbol intervals to produce a statistic value y, and means for thresholding said statistic value y at a level $\delta$ to produce a symbol lock decision when said statistic value y exceeds said level $\delta$.

* * * * *